(12) United States Patent
Nagahara et al.

(10) Patent No.: US 6,984,922 B1
(45) Date of Patent: Jan. 10, 2006

(54) COMPOSITE PIEZOELECTRIC TRANSDUCER AND METHOD OF FABRICATING THE SAME

(75) Inventors: Hidetomo Nagahara, Kyoto (JP); Takehiko Suginouchi, Nara (JP); Masahiko Hashimoto, Shijonawate (JP); Katsuhiko Asai, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 64 days.

(21) Appl. No.: 10/620,083

(22) Filed: Jul. 15, 2003

(30) Foreign Application Priority Data

Jul. 22, 2002 (JP) .............................. 2002-212072

(51) Int. Cl. *H01L 41/09* (2006.01)
(52) U.S. Cl. ........................ 310/334; 310/321; 310/367
(58) Field of Classification Search ................ 310/320, 310/321, 334, 367, 369
See application file for complete search history.

(56) References Cited

U.S. PATENT DOCUMENTS

| | | | | |
|---|---|---|---|---|
| 3,569,750 A | * | 3/1971 | Beaver | 310/320 |
| 4,281,550 A | * | 8/1981 | Erikson | 73/626 |
| 5,164,920 A | * | 11/1992 | Bast et al. | 367/140 |
| 5,477,098 A | | 12/1995 | Eguchi et al. | |
| 5,717,274 A | | 2/1998 | Eguchi et al. | |
| 6,566,265 B2 | * | 5/2003 | Esashi et al. | 438/689 |
| 6,720,715 B1 | * | 4/2004 | Bicz | 310/367 |
| 2002/0042572 A1 | | 4/2002 | Fukukita | |
| 2003/0127949 A1 | | 7/2003 | Nagahara et al. | |

FOREIGN PATENT DOCUMENTS

| | | | |
|---|---|---|---|
| EP | 0 641 606 A2 | | 3/1995 |
| EP | 1384525 A2 | * | 1/2005 |
| JP | 58-021883 A | | 2/1983 |
| JP | 60-085699 A | | 5/1985 |
| JP | 63-059200 A | | 3/1988 |
| JP | 02-051289 A | | 2/1990 |
| JP | 05-347797 A | | 12/1993 |
| JP | 08-088896 A | | 4/1996 |
| JP | 08-088897 A | | 4/1996 |
| JP | 08-088898 A | | 4/1996 |
| JP | 08-256398 A | | 10/1996 |
| JP | 08-265098 A | | 10/1996 |
| JP | 08-275295 | | 10/1996 |
| JP | 10-051041 | | 2/1998 |
| JP | 10-056690 A | | 2/1998 |
| JP | 10-285695 A | | 10/1998 |
| JP | 11-285096 | | 10/1999 |
| JP | 2000-028595 A | | 1/2000 |
| JP | 2000-324599 A | | 11/2000 |
| JP | 2001-025094 A | | 1/2001 |

OTHER PUBLICATIONS

Hirata, et al., "Piezocomposite of Fine PZT Rods Realized with Synchrotron Radiation Lithography", *IEEE Ultrasonics Symposium*, pp. 877-881 (1997).
Wang, et al., "Novel Processing of High Aspect Ration 1-3 Structures of High Density PZT", *IEEE*, pp. 223-228 (1998).

* cited by examiner

*Primary Examiner*—Thomas M. Dougherty
(74) *Attorney, Agent, or Firm*—Akin Gump Strauss Hauer & Feld, LLP

(57) ABSTRACT

A composite piezoelectric transducer of the present invention includes a plurality of arranged piezoelectric elements, and dielectric portions positioned between the plurality of piezoelectric elements. In the composite piezoelectric transducer, an area of a cross-section perpendicular to an ultrasonic emitting direction in at least one piezoelectric element of the plurality of piezoelectric elements varies along the ultrasonic emitting direction.

18 Claims, 13 Drawing Sheets

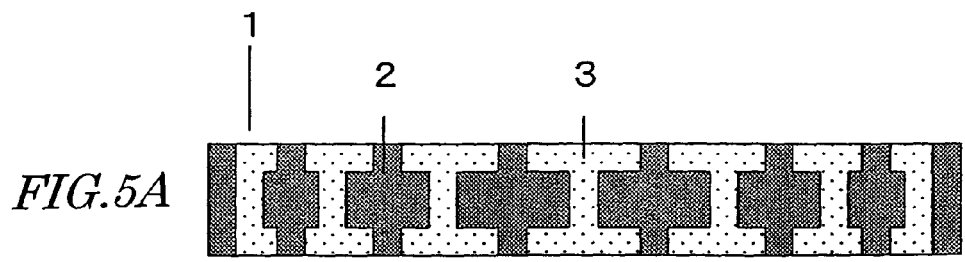
*FIG.5A*
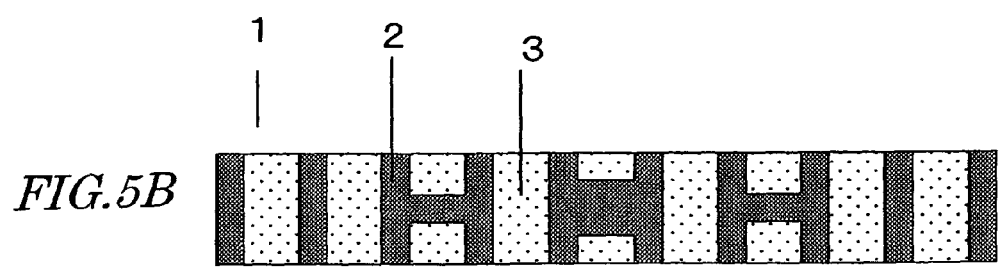
*FIG.5B*
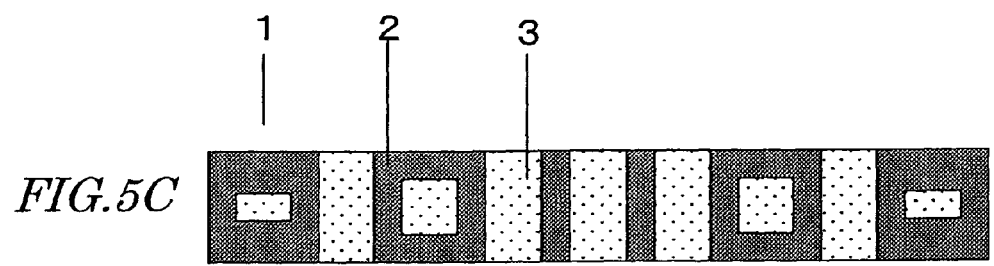
*FIG.5C*
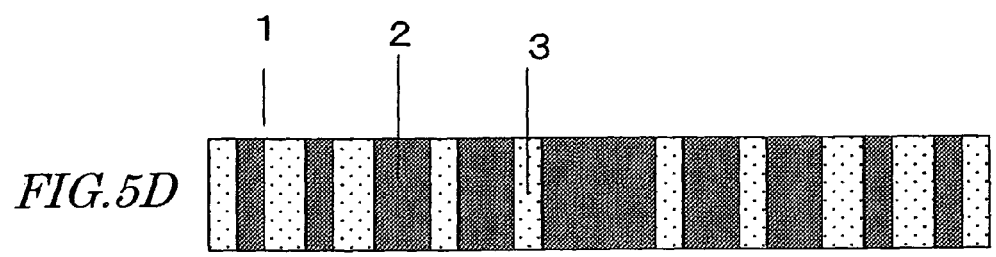
*FIG.5D*
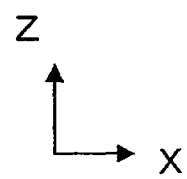

COMPOSITE PIEZOELECTRIC TRANSDUCER AND METHOD OF FABRICATING THE SAME

BACKGROUND OF THE INVENTION

The present invention relates to a composite piezoelectric transducer used for an ultrasonic probe and the like, particularly to a composite piezoelectric transducer having a resonance frequency distribution in plane, and to a method of fabricating the composite piezoelectric transducer. The present invention also relates to an ultrasonic probe and an ultrasonic examination device which employ the composite piezoelectric transducer and in which aperture control can be performed in a minor axis direction.

Japanese Laid-Open Patent Publication No.7-107595, for example, describes a known and conventional ultrasonic probe which can perform aperture control in a minor axis direction of the ultrasonic probe, and which has resonance frequency characteristics in a wide frequency band.

A conventional ultrasonic probe 100 shown in FIG. 16 is provided with a piezoelectric element 101 of which the thickness varies along the X direction. A matching layer 102 is disposed on an ultrasonic emitting face of the piezoelectric element 101. A large number of piezoelectric transducers each constituted by the piezoelectric element 101 and the matching layer 102 are arranged along the Y direction, and supported by a back-face load member 103.

In each of the piezoelectric elements 101, the thickness is the minimum in a center portion along the X direction, and the thickness is increased as getting closer to both ends. With piezoelectric elements having such a configuration, it is possible to transmit and receive ultrasonic waves of higher frequencies in a center portion in the X direction of the piezoelectric transducer. In a peripheral portion, it is possible to transmit and receive ultrasonic waves of lower frequencies. As a result, the resonance frequency characteristics of the ultrasonic piezoelectric transducer are realized in a wider frequency band.

In the ultrasonic piezoelectric transducer shown in FIG. 16, an aperture size in the X direction is smaller with respect to the ultrasonic waves of higher frequencies, but is wider with respect to the ultrasonic waves of lower frequencies. Accordingly, it is possible to form a narrow ultrasonic beam from a short range to a long range, so that high resolution can be attained from a short range to a long range.

In the conventional ultrasonic probe shown in FIG. 16, however, the surface of the piezoelectric element is required to be worked so as to have a concave shape. In addition, it is necessary to form a matching layer having different curvatures in the concave face of the piezoelectric element. The production of such an ultrasonic probe is very difficult, or even if such an ultrasonic probe can be produced, the production is at variance with the reality in terms of the production yield and cost.

SUMMARY OF THE INVENTION

The invention provides a composite piezoelectric transducer which can transmit and receive ultrasonic waves in a wide band, while the thickness of the composite piezoelectric transducer is uniform, and a method of producing the composite piezoelectric transducer.

The present invention also provides an ultrasonic probe and an ultrasonic examination device provided with such a composite piezoelectric transducer.

The composite piezoelectric transducer of the present invention is a composite piezoelectric transducer including a plurality of arranged piezoelectric elements, and dielectric portions positioned between the plurality of piezoelectric elements, wherein an area of a cross-section perpendicular to an ultrasonic emitting direction in at least one piezoelectric element of the plurality of piezoelectric elements varies along the ultrasonic emitting direction.

In a preferred embodiment, the at least one piezoelectric element has a resonance frequency which is different from resonance frequencies of the other piezoelectric elements.

In a preferred embodiment, the resonance frequencies of the plurality of piezoelectric elements have a distribution in which a difference between the minimum value and the maximum value is equal to or more than 10% of a mean value.

In a preferred embodiment, each of the plurality of piezoelectric elements has a size in a certain direction perpendicular to the ultrasonic emitting direction, the size being fixed along the ultrasonic emitting direction.

In a preferred embodiment, each of the plurality of piezoelectric elements has a uniform thickness along the ultrasonic emitting direction.

In a preferred embodiment, the plurality of piezoelectric elements are two-dimensionally arranged along a plane perpendicular to the ultrasonic emitting direction of the piezoelectric elements, and resonance frequencies of the plurality of piezoelectric elements are varied depending on the positions thereof in the plane.

In a preferred embodiment, the plurality of piezoelectric elements have a substantially uniform height.

In a preferred embodiment, resonance frequencies of the piezoelectric elements in a peripheral portion of a plane perpendicular to the ultrasonic emitting direction of the piezoelectric elements are lower than resonance frequencies of the piezoelectric elements in a center portion of the plane.

In a preferred embodiment, an area of a cross-section perpendicular to an ultrasonic emitting direction of at least one of the plurality of piezoelectric elements in an end face of the piezoelectric element is larger than the area in a center of the piezoelectric element.

In a preferred embodiment, an area of a cross-section perpendicular to an ultrasonic emitting direction of at least one of the plurality of piezoelectric elements in an end face of the piezoelectric element is smaller than the area in a center of the piezoelectric element.

In a preferred embodiment, each of the plurality of piezoelectric elements has a pair of columnar portions extending in the ultrasonic emitting direction, and a thickness of a bridging portion for coupling the columnar portions in the middle thereof is varied in a plane perpendicular to the ultrasonic emitting direction of the piezoelectric elements.

In a preferred embodiment, each of the plurality of piezoelectric elements has an opening portion in the center thereof, and a size of the opening portion is varied in a plane perpendicular to the ultrasonic emitting direction of the piezoelectric elements.

In a preferred embodiment, shapes of the plurality of piezoelectric elements are selected so that resonance frequencies of the plurality of piezoelectric elements have a predetermined distribution in plane.

In a preferred embodiment, a ratio of a size in the ultrasonic emitting direction of the piezoelectric element to the minimum size S of a cross-section perpendicular to the ultrasonic emitting direction of the piezoelectric element is 5 or more.

In a preferred embodiment, the dielectric portion is formed from a resin.

In a preferred embodiment, a modulus of elasticity of the resin has a predetermined distribution in accordance with positions of the piezoelectric elements in a plane perpendicular to the ultrasonic emitting direction.

The unit composite sheet of the present invention is a unit composite sheet including a resin layer and a plurality of piezoelectric elements arranged on the resin layer, wherein the plurality of piezoelectric elements have different shapes depending on the positions thereof on the resin layer.

The layered structure of composite sheets of the present invention is a layered structure of composite sheets, wherein a plurality of unit composite sheets each including a resin layer and a plurality of piezoelectric elements arranged on the resin layer are layered, the piezoelectric elements are sandwiched by the resin layers, thereby fixing the dispositional relationship, and the plurality of piezoelectric elements included in each of the unit composite sheets have different shapes depending on the positions thereof on the resin layer.

The composite piezoelectric transducer of the present invention is a composite piezoelectric transducer fabricated by cutting a layered structure of composite sheets in which a plurality of unit composite sheets each including a resin layer and a plurality of piezoelectric elements arranged on the resin layer are layered, the piezoelectric elements are sandwiched by the resin layers, thereby fixing the dispositional relationship, and the plurality of piezoelectric elements included in each of the unit composite sheets have different shapes depending on the positions thereof on the resin layer, the cutting being performed across an ultrasonic emitting direction of the piezoelectric elements.

In a preferred embodiment, the piezoelectric elements are surrounded by a resin.

In a preferred embodiment, the resin is part of the resin layer of the unit composite sheet which flows and hardens.

The ultrasonic probe of the present invention is an ultrasonic probe including: a composite piezoelectric transducer including a plurality of arranged piezoelectric elements and dielectric portions positioned between the plurality of piezoelectric elements; an area of a cross-section perpendicular to an ultrasonic emitting direction in at least one of the plurality of piezoelectric elements being varied along the ultrasonic emitting direction; and a pair of electrodes formed on the composite piezoelectric transducer.

In a preferred embodiment, a matching layer is formed on the composite piezoelectric transducer, and a thickness of the matching layer is varied along a direction in which resonance frequencies of the piezoelectric elements in the composite piezoelectric transducer are varied.

The ultrasonic examination device of the present invention is an ultrasonic examination device including an ultrasonic probe, a transmitting section for transmitting a signal to the ultrasonic probe, and a receiving portion for receiving an electric signal output from the ultrasonic probe, wherein the ultrasonic probe includes: a composite piezoelectric transducer including a plurality of arranged piezoelectric elements and dielectric portions positioned between the plurality of piezoelectric elements, an area of a cross-section perpendicular to an ultrasonic emitting direction in at least one of the plurality of piezoelectric elements being varied along the ultrasonic emitting direction; and a pair of electrodes formed on the composite piezoelectric transducer.

The production method of the present invention is a method of producing a unit composite sheet including the steps of: (a) providing a composite plate in which a resin layer is formed on one surface of a plate-like piezoelectric element; and (b) forming a plurality of piezoelectric elements from the plate-like piezoelectric element by forming a plurality of grooves in the plate-like piezoelectric element of the composite plate without completely dividing the resin layer, wherein the step (b) applies different shapes to the plurality of piezoelectric elements depending on the positions thereof on the resin layer.

The production method of the present invention is a method of producing a unit composite sheet comprising the steps of: (a) temporarily fixing a plate-like piezoelectric element on a substrate by means of an adhesive sheet; (b) forming a plurality of columnar piezoelectric elements from the plate-like piezoelectric element by forming a plurality of grooves in the plate-like piezoelectric element; and (c) transferring the plurality of columnar piezoelectric elements temporarily fixed on the substrate onto a resin layer, wherein the step (b) applies different shapes to the plurality of piezoelectric elements depending on the positions thereof on the resin layer.

In a preferred embodiment, the plurality of grooves are formed by sand blasting.

The production method of the invention is a method of producing a composite piezoelectric transducer including the steps of: (a) providing a plurality of unit composite sheets each including a resin layer and a plurality of piezoelectric elements arranged on the resin layer, the plurality of piezoelectric elements having different shapes depending on the positions thereof on the resin layer; (b) layering the plurality of unit composite sheets; and (c) integrating the plurality of layered unit composite sheets.

In a preferred embodiment, the production method further includes a step of cutting the integrated unit composite sheets across the piezoelectric elements.

BRIEF DESCRIPTION OF THE SEVERAL VIEWS OF THE DRAWINGS

The foregoing summary as well as the following detailed description of the preferred embodiments of the invention, will be better understood when read in conjunction with the appended drawings. For the purpose of illustrating the invention, there is shown in the drawings an embodiment which is presently preferred. It should be understood, however, that the invention is not limited to the precise arrangements and instrumentalities shown.

FIGS. 5A to 5D are sectional views illustrating various configurations of a composite piezoelectric transducer of the invention related to Embodiment 2.

DETAILED DESCRIPTION OF THE INVENTION

Hereinafter, preferred embodiments of the invention will be described with reference to the accompanying drawings.

Embodiment 1

Figure 1:
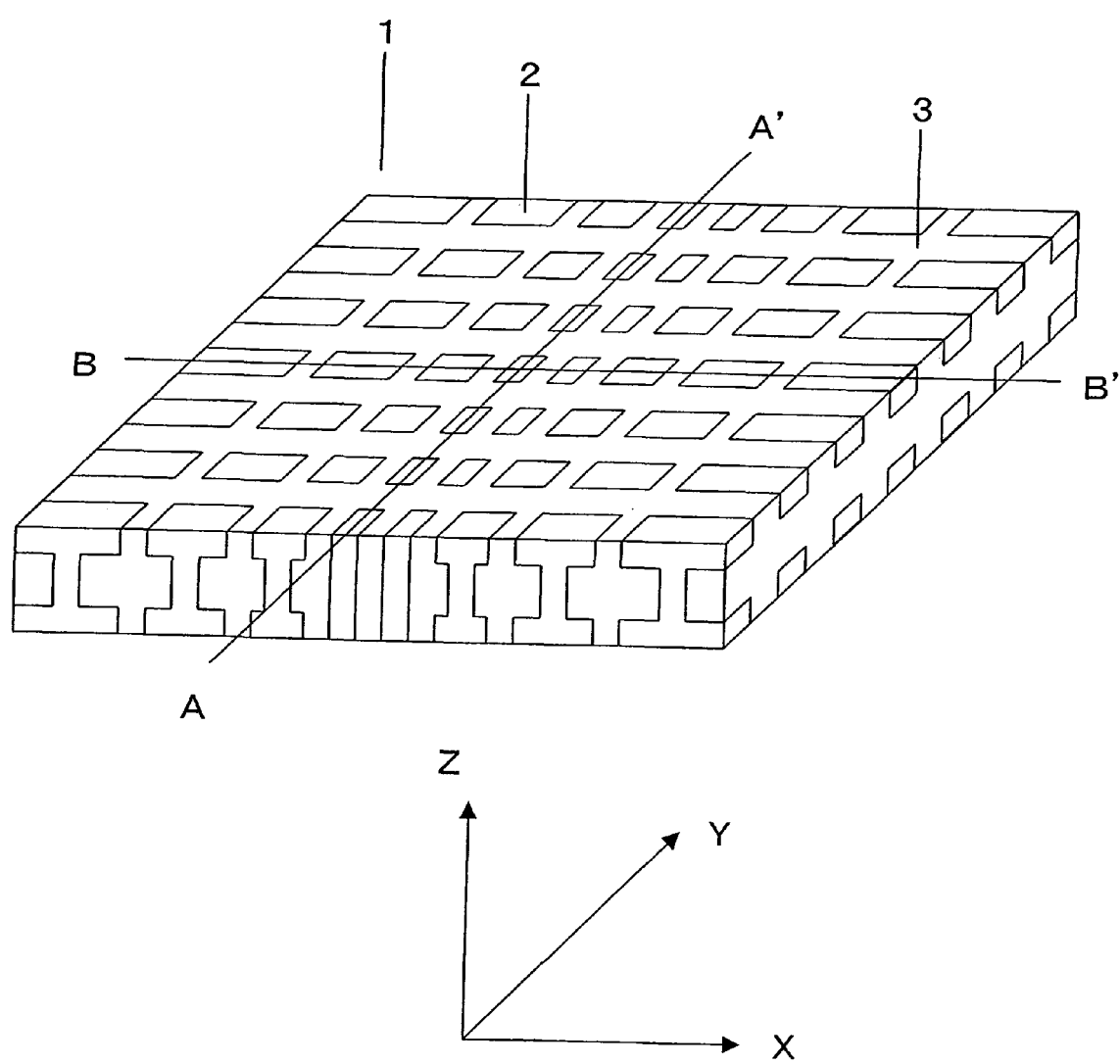
FIG. 1 is a perspective view illustrating a composite piezoelectric transducer in Embodiment 1 of the invention.

FIG. 1 is a view showing a first embodiment of a composite piezoelectric transducer according to the invention. In a composite piezoelectric transducer 1 of this embodiment, in an X-Y plane of coordinates shown in FIG. 1, a plurality of piezoelectric elements 2 are two-dimensionally arranged. Spaces between the piezoelectric elements 2 are filled with a resin 3, and a dispositional relationship between respective two piezoelectric elements 2 is mutually fixed. As a result, an integrated composite piezoelectric transducer 1 is constructed.

Each of the piezoelectric elements 2 in this embodiment has a substantially columnar shape extending in Z direction (an ultrasonic emitting direction). Each of the piezoelectric elements 2 extends and contracts in the Z direction so as to emit ultrasonic waves in the Z direction. Both end faces of each piezoelectric element 2 are leveled with an upper face and a lower face of the composite piezoelectric transducer 1, respectively. The upper face and the lower face of the composite piezoelectric transducer 1 are perpendicular to the Z direction and in parallel to the X-Y plane. In this specification, the upper face of the composite piezoelectric transducer 1 shown in FIG. 1 is referred to as "an ultrasonic emitting face".

In FIG. 1, both end faces of the piezoelectric element 2 are illustrated so as to be exposed. In actuality, on the upper face and the lower face of the composite piezoelectric transducer 1, electrodes (not shown) are formed, respectively, to apply an electric signal across the piezoelectric elements 2 each of which is polarized in the Z direction.

A material for the piezoelectric elements used in the composite piezoelectric transducer 1 of this embodiment is not specifically limited, if the material has piezoelectric characteristics. As the material, a piezoelectric ceramic, a piezoelectric single crystal, or the like can be suitably used. As the piezoelectric ceramic, lead zirconate titanate, lead titanate, barium titanate, or the like is used. As the piezoelectric single crystal, quartz, lithium niobate, a single crystal of lead zirconate titanate, or the like is used. This embodiment employs lead zirconate titanate-based (PZT) ceramic which has higher piezoelectric characteristics, and which can be relatively easily worked, as the material for the piezoelectric elements.

A resin for constituting the composite piezoelectric transducer 1 may be a material which can fix the positional relationship between the respective piezoelectric elements 2 and integrate them. Thus, an epoxy-based resin, an acrylic resin, or the like can be used. This embodiment employs an epoxy resin in view of the adhesive property to the piezoelectric ceramic.

The electrodes disposed on both end faces of the composite piezoelectric transducer 1 perpendicular to the Z direction are preferably formed from a material with low electric resistance and superior adhesion. As the electrode material, a general metal such as gold, silver, or nickel can be used. As a method for forming the electrodes, plating, sputtering, vapor deposition, or the like can be used. In this embodiment, a metal film including two layers of nickel and gold is formed by electroless plating. The thickness of the nickel plated layer and the thickness of the gold plated layer can be set to be 2 $\mu$m and 0.1 $\mu$m, respectively.

Hereinafter, the configuration of the composite piezoelectric transducer 1 will be described in more detail.

Figure 2:
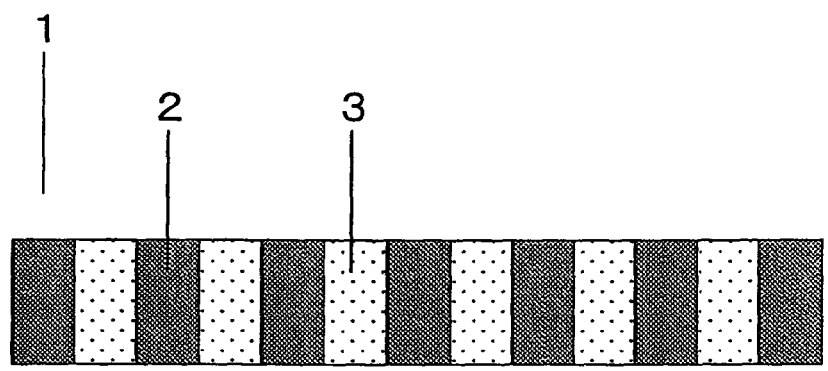
FIG. 2 is a sectional view taken along a line A-A' of the composite piezoelectric transducer in Embodiment 1.
Figure 2:
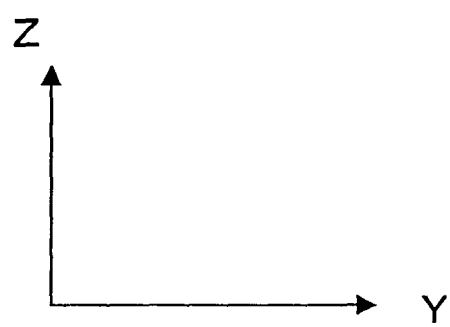

FIG. 2 shows a cross-section taken along a line A-A' of the composite piezoelectric transducer in FIG. 1. As shown in FIG. 2, among a plurality of piezoelectric elements constituting the composite piezoelectric transducer 1, each of piezoelectric elements arranged along the Y direction has the identical shape. Accordingly, the resonance frequency characteristics of the piezoelectric elements 2 are constant along the Y direction, and the resonance frequency is not varied in the composite piezoelectric transducer along the Y direction.

Figure 3:
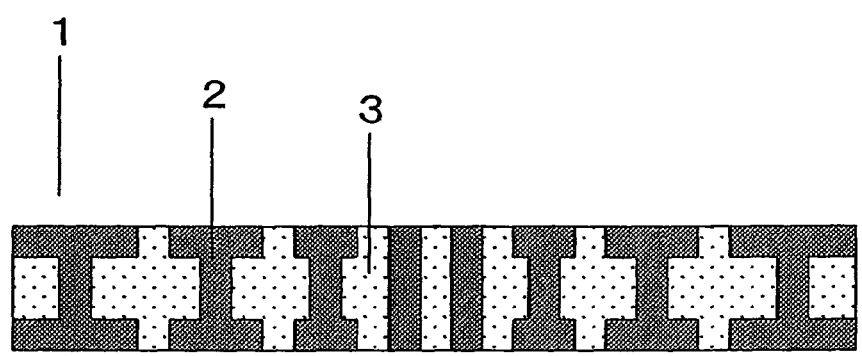
FIG. 3 is a sectional view taken along a line B-B' of the composite piezoelectric transducer in Embodiment 1.
Figure 3:
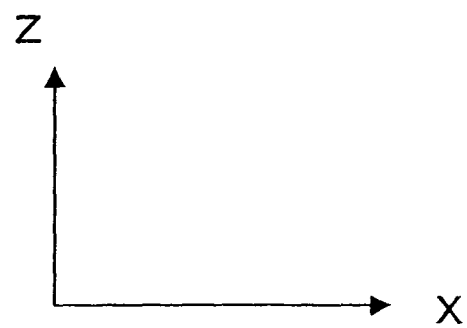

FIG. 3 shows a cross-section taken along a line B-B' of the composite piezoelectric transducer in FIG. 1. As shown in FIG. 3, among the plurality of piezoelectric elements constituting the composite piezoelectric transducer 1, piezoelectric elements 2 arranged along the X direction have different shapes depending on the respective positions (X coordinates). Thus, the resonance frequency characteristics of each piezoelectric element 2 are varied along the X direction (that is, there exists a distribution).

Hereinafter, the configuration of the piezoelectric element 2 will be described in detail.

In this embodiment, a length L of each piezoelectric element 2 measured in the Z direction, i.e., a thickness of the composite piezoelectric transducer 1 is set to be about 0.25 mm (250 $\mu$m). Among the piezoelectric elements 2 shown in FIG. 3, each of the piezoelectric elements 2 positioned in a center portion with respect to the X direction has a uniform shape in the Z direction (a straight columnar shape). A width (a size S measured along the X direction) of the piezoelectric element 2 in FIG. 3 is about 0.05 mm (50 $\mu$m). Accordingly, a ratio (L/S: aspect ratio) of the length (height) L to the size (the minimum size) S of the piezoelectric element 2 is about 5.

The resonance frequency in the Z direction (the resonance frequency in the thickness direction) of the piezoelectric element 2 is about 5.7 MHz., and an antiresonance frequency thereof is 7.7 MHz. The electromechanical coupling factor in this oscillating condition is about 0.7.

On the other hand, among the piezoelectric elements 2 shown in FIG. 3, each of piezoelectric elements 2 positioned in a peripheral portion with respect to the X direction has a cross-section with a shape similar to an alphabet letter "I". The piezoelectric element 2 of I-shaped type includes a center portion having a fixed width which is common to the respective piezoelectric elements 2, and an upper end portion and a lower end portion coupled to both ends of the center portion, respectively. The size in Z direction of the center portion of the piezoelectric element 2 of I-shaped type is 0.15 mm, the size in Z direction of the upper end portion is 0.05 mm, and the size in Z direction of the lower end portion is 0.05. The sizes in X direction of the upper end portion and the lower end portion of the piezoelectric element 2 of I-shaped type are varied along the X direction, as is seen from FIG. 3. The sizes in X direction of the upper end portion and the lower end portion of the piezoelectric element 2 positioned closest to the end of FIG. 3 are 0.1 mm.

With the piezoelectric element 2 having such a shape, the upper end portion and the lower end portion function as dead weights. Accordingly, as the sizes in X direction of the upper end portion and the lower end portion are increased, the resonance frequency in Z direction is lowered. In the case of the above-described piezoelectric element 2 including the upper end portion and the lower end portion having the sizes in X direction of 0.1 mm, the resonance frequency in Z direction (the resonance frequency in the thickness direction) is about 3.1 MHz. The antiresonance frequency is 4.1 MHz, and the electromechanical coupling factor is about 0.68.

The resonance frequency of piezoelectric elements 2 positioned between the center portion and the end portion in the X direction of the composite piezoelectric transducer 1 can be set to be a value in the range of 3.1 to 5.7 MHz by adjusting the sizes in X direction of the upper end portion and the lower end portion in the range of 0.05 to 0.10 mm.

Among a row of piezoelectric elements 2 arranged along the X direction, the sizes in Y direction of the respective piezoelectric elements 2 are uniform. In each of the piezoelectric elements 2, the size in Y direction is not varied along the Z direction. In other words, the shape of a face obtained by projecting each of the piezoelectric elements 2 on the Z-Y plane is substantially rectangular, and the shape is uniform irrespective of the position in X direction of the piezoelectric element 2. In addition, the shape of the projected face is uniform irrespective of the position in Y direction of the piezoelectric element 2 in this embodiment (see FIG. 2).

In FIG. 3, for simplicity, only eight piezoelectric elements 2 are shown. In actuality, in the case where the size in X direction of the composite piezoelectric transducer 1 is 12 mm, and the arranged pitches of the piezoelectric elements 2 are 0.15 mm, eighty piezoelectric elements 2 are arranged in the X direction.

FIG. 3 shows four pairs of piezoelectric elements 2 having four kinds of shapes, respectively. The piezoelectric elements 2 are arranged symmetrically with respect to an axis passing through the center portion of the composite piezoelectric transducer 1 (an axis parallel to the Z direction). The present invention is, however, not limited to such a configuration. Alternatively, the number of kinds of shapes of the piezoelectric elements 2 included in a plurality of piezoelectric elements 2 arranged in parallel to the X direction may be five or more. Alternatively, two or more piezoelectric elements 2 having the identical shape may be continuously disposed along the X direction. In other words, piezoelectric elements 2 having shapes which are gradually changed depending on the positions thereof in X direction (the X-coordinates) may be arranged from the center to the peripheral portion one by one, or groups of several numbers of piezoelectric elements 2 having the same shape may be arranged.

In this embodiment, it is designed that the resonance frequency is the highest at the center of the composite piezoelectric transducer 1, and the resonance frequency is reduced toward the peripheral portion from the center along the X direction. The invention is not limited to this design. According to the uses, the distribution of resonance frequency can be arbitrarily set.

Figure 4:
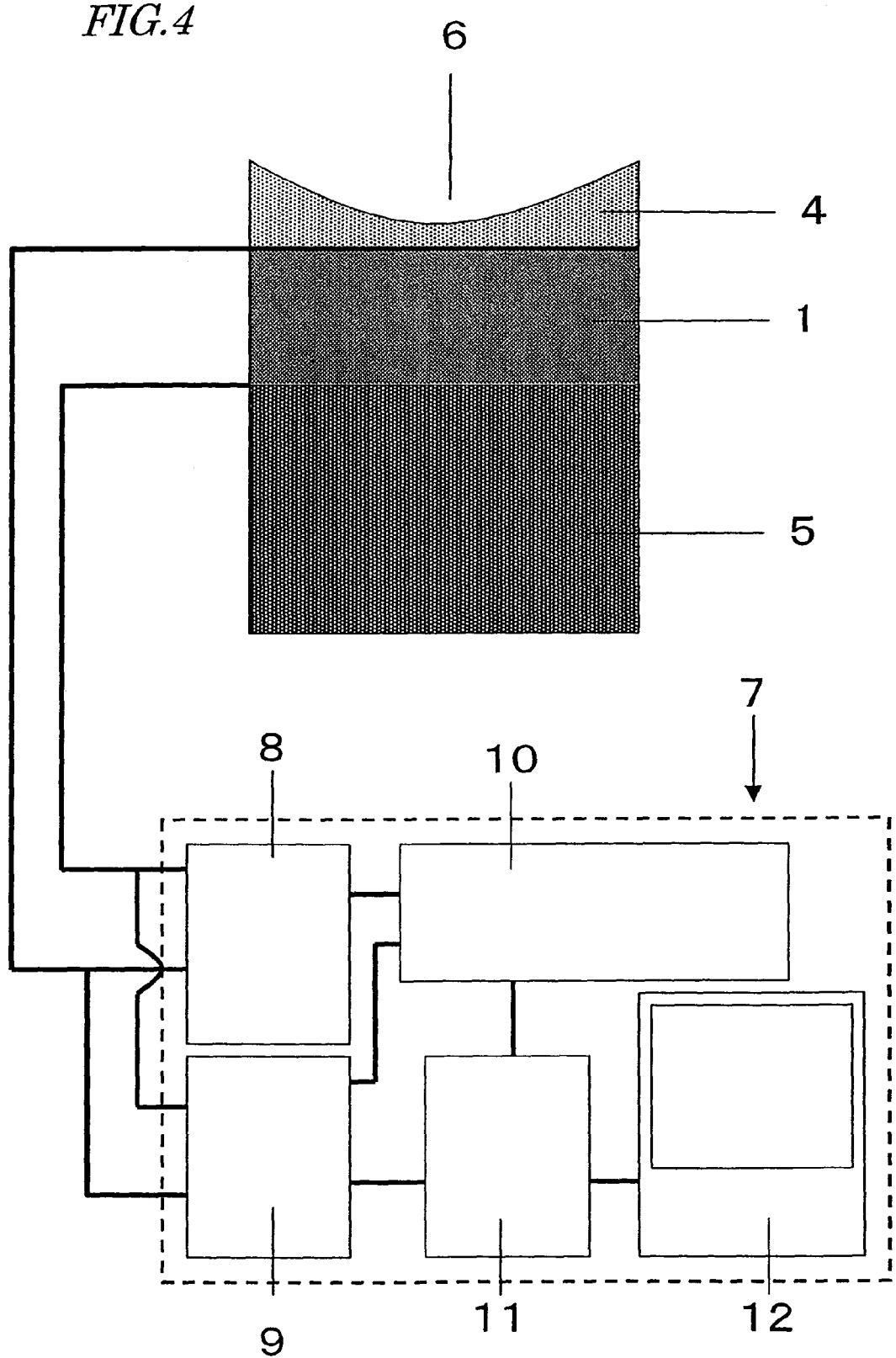
FIG. 4 is a diagram illustrating an exemplary configuration of an ultrasonic probe and an ultrasonic examination device of the invention.

With reference to FIG. 4, an ultrasonic probe and an ultrasonic examination device using the above-described composite piezoelectric transducer 1 will be described.

FIG. 4 is a diagram showing the configuration of the ultrasonic probe and the ultrasonic examination device. In FIG. 4, the ultrasonic probe 6 includes a composite piezoelectric transducer 1, an acoustic matching layer 4 formed on an ultrasonic emitting face of the composite piezoelectric transducer 1, and a back-face load member 5 disposed on a back face of the composite piezoelectric transducer 1. The composite piezoelectric transducer 1 has the same configuration as that shown in FIGS. 1 to 3.

The acoustic matching layer 4 is disposed for the purpose of efficiently propagating the ultrasonic waves generated from the composite piezoelectric transducer 1. The acoustic matching layer 4 in FIG. 4 has a thickness in accordance with the resonance frequency of the composite piezoelectric transducer 1 directly under the layer. The acoustic matching layer 4 is required to satisfy two conditions of acoustic impedance and a thickness which will be described next.

The acoustic impedance is determined by the product of the velocity of sound and the density. When the acoustic impedance of the composite piezoelectric transducer 1 is indicated by Zp, and the acoustic impedance of a human body or the like which is a propagating medium of ultrasonic waves is indicated by Zs, the acoustic impedance Zm of the acoustic matching layer 4 is preferred to satisfy the following Equation 1:

$$Zm = (Zp \times Zs)^{(1/2)} \qquad \text{(Equation 1)}$$

The thickness of the acoustic matching layer 4 is preferred to be ¼ of the wavelength of the ultrasonic waves to be transmitted and received.

The acoustic impedance Zm of the acoustic matching layer 4 and the thickness of the acoustic matching layer 4 are set to be optimum values, so that the reflection of ultrasonic waves at the interface between the ultrasonic probe 6 and a human body or the like as a propagating medium is minimized, and the ultrasonic examination with high sensitivity can be realized.

In this embodiment, the acoustic matching layer 4 is formed from an epoxy resin. Since the velocity of sound in the epoxy resin is about 2500 m/s, the thickness of the acoustic matching layer 4 is set to be about 0.4 mm in the center portion and about 0.8 mm in the peripheral portion in accordance with the resonance frequencies of the ultrasonic waves to be transmitted and received by the composite piezoelectric transducer 1.

The back-face load member 5 disposed on the back-face side of the composite piezoelectric transducer 1 exhibits the function of attenuating the ultrasonic waves generated in the composite piezoelectric transducer 1 and propagated in a direction reversed to the ultrasonic emitting direction. The back-face load member 5 contributes to the prevention of reflection of ultrasonic waves from the back-face side, and to the widening of band of the resonance frequency characteristics of the ultrasonic probe 6. In other words, the provision of the back-face load member 5 enables the ultrasonic pulse with short pulse width to be transmitted and received, so that the ultrasonic examination with high resolution can be realized. This embodiment employs the back-face load member 5 made from a rubber in which iron powder is dispersed.

With the ultrasonic probe 6 of this embodiment, while the thickness of the composite piezoelectric transducer 1 is uniform, the transmission and receiving of ultrasonic waves of higher frequencies can be performed in the center portion, and the transmission and receiving of ultrasonic waves of lower frequencies can be performed in the peripheral portion. Accordingly, it is possible for the ultrasonic probe 6 to operate in wider resonance frequency band. This is because, as shown in FIGS. 1 to 3, piezoelectric elements 2 having different resonance frequencies are two-dimensionally arranged in the composite piezoelectric transducer 1.

In the case of an ultrasonic probe in which an acoustic matching layer having a uniform thickness is disposed on a general plate-like piezoelectric element, if the resonance frequency is designed to be 4 MHz, the band defined by the resonance frequency indicating the value of −6 dB for the resonance frequency of 4 MHz is about 2.8 to 5.2 MHz, so that the specific band is about 60%. On the contrary, the ultrasonic probe of this embodiment has the specific band of about 60% in 3.1 to 5.7 MHz. Accordingly, the whole of the ultrasonic probe has a wide frequency band of 1.9 to 6.9 MHz. When the center resonance frequency is set to be 3.4 MHz which is the median of 1.9 to 6.9 MHz, and the specific band is calculated, it is found that the ultrasonic probe has an extremely wide frequency specific band of about 150%.

The ultrasonic probe 6 is used by being connected to the ultrasonic examination device 7 shown in FIG. 4. The ultrasonic examination device 7 includes a transmitting section 8 for transmitting an ultrasonic signal to the ultrasonic probe 6, a receiving section 9 for receiving a voltage signal output from the ultrasonic probe 6, a system control section 10 for performing various controls related to the transmission and receiving of ultrasonic signals, an image constructing section 11 for forming an image based on the obtained ultrasonic signal, and an image display section 12 for displaying an image based on the image signal output from the image constructing section 11.

The ultrasonic examination device 1 of this embodiment operates in the following manner.

A driving pulse generated in the transmitting section 8 is applied to the electrodes disposed on both faces of the composite piezoelectric transducer 1, thereby straining the composite piezoelectric transducer 1 in the thickness direction, so as to generate ultrasonic waves. The generated ultrasonic waves are propagated to a human body, or the like as a body to be examined (not shown) through the acoustic matching layer 4. The ultrasonic waves scattered and/or reflected in the human body are then returned to the composite piezoelectric transducer 1. The reflected ultrasonic waves received by the composite piezoelectric transducer 1 are converted into an electric signal. The electric signal is made into an image through the receiving section 9. The image is displayed on the image display section 12.

Signals received immediately after the application of the driving pulse are signals from a short range, so that only signals of higher frequencies are selected by a filter, and imaged. Thus, an image with high resolution in which an ultrasonic beam is focused on a short range can be constructed.

Signals received after a predetermined time are signals from a long range, so that signals of lower frequencies are received by means of a filter, and imaged. Thus, it is possible to construct an image with high resolution in which an ultrasonic beam is focused on a long range. In this way, images in which ultrasonic beams are focused on respective points from a short range to a long range can be obtained.

The composite piezoelectric transducer 1 of this embodiment has a uniform thickness, so that an acoustic matching layer can be easily formed thereon. In addition, ultrasonic waves from lower frequencies to higher frequencies can be transmitted and received, and a wider band is realized, so that ultrasonic waves of short pulses can be transmitted and received, and the resolution in a depth direction can be improved.

According to the composite piezoelectric transducer 1 of this embodiment, the transmission and receiving of ultrasonic waves of higher frequencies is performed in a region of narrow opening in the center portion, and the transmission and receiving of ultrasonic waves of lower frequencies is performed in a region of wide opening of the peripheral portion, so that the size of the opening can be controlled in accordance with the resonance frequency of the ultrasonic waves. Thus, in a wide range from a short range to a long range, narrow ultrasonic beams can be formed, and the resolution in an azimuth direction can be improves.

Embodiment 2

With reference to FIGS. 5A to 5D, the second embodiment of the invention will be described. This embodiment is different from Embodiment 1 in shapes of respective piezoelectric elements 2. The other points are the same as those in Embodiment 1.

FIGS. 5A to 5D are sectional views corresponding to FIG. 2, and show cross-sections of five kinds of composite piezoelectric transducers. Each of the composite piezoelectric transducers 1 has a uniform configuration in the Y direction, so that a cross-section taken in an arbitrary position along the Y direction is the same as the cross-section shown in a corresponding one of FIGS. 5A to 5D.

In the composite piezoelectric transducer 1 of FIG. 5A, an area of a cross-section perpendicular to a longitudinal direction (the Z direction) of a piezoelectric element 2 in each of end faces of the piezoelectric element 2 is smaller than that in the center of the piezoelectric element 2. In addition, the areas of cross-sections perpendicular to the longitudinal direction in the center of the respective piezoelectric elements 2 are varied along the X direction. It is designed that, among a plurality of piezoelectric elements arranged along the X direction, the resonance frequency of the piezoelectric element 2 positioned in the center portion of the composite piezoelectric transducer 1 is higher than resonance frequencies of the piezoelectric elements 2 positioned in the peripheral portion of the composite piezoelectric transducer 1.

In the composite piezoelectric transducer 1 of FIG. 5B, each of piezoelectric elements 2 has a pair of columnar portions, and a bridge portion (a bridging portion) for coupling them is disposed between the pair of columnar portions. The thickness of the bridging portion of each of the piezoelectric elements 2 is varied along the X direction. Specifically, the bridging portion of the piezoelectric element 2 in the center portion with respect to the X direction is relatively thick, and the bridging portion of the piezoelectric element 2 closer to the peripheral portion with respect to the X direction has a thinner thickness. With such a configuration, it is possible to relatively increase the resonance frequency in the center portion in plane of the composite piezoelectric transducer.

In the composite piezoelectric transducer 1 of FIG. 5C, each piezoelectric element 2 has an opening portion in the center thereof, and the size of the opening portion is varied along the X direction. Conversely to the configuration of FIG. 5B, both end portions are heavier in a piezoelectric element having a smaller opening, so that the resonance frequency is lowered.

In the composite piezoelectric transducer 1 of FIG. 5D, an area of a cross-section perpendicular to the longitudinal direction of a piezoelectric element is fixed along the X direction, but the area has a different value depending on a position of the piezoelectric element in plane. Specifically, in a piezoelectric element 2 closer to the peripheral portion of the composite piezoelectric transducer 1, the piezoelectric element 2 is narrower. With such a configuration, the transmission and receiving of ultrasonic waves of higher frequencies can be performed in the center portion of the composite piezoelectric transducer, and the transmission and receiving of ultrasonic waves of lower frequencies can be performed in the end portion of the composite piezoelectric transducer.

Embodiment 3

Figure 6:
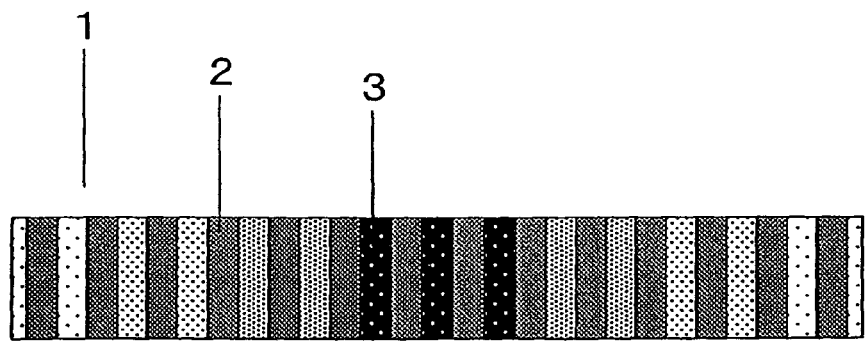
FIG. 6 is a sectional view illustrating a composite piezoelectric transducer in Embodiment 3 of the invention.

This embodiment is characterized in that different materials are used for dielectric portions along the X direction. FIG. 6 is a sectional view corresponding to FIG. 3.

As shown in FIG. 6, in the center portion in the X direction, the dielectric portion is formed by using a hard material with high elastic modulus. In the peripheral portions, the dielectric portions are formed by using a soft material with low elastic modulus.

In this embodiment, since the surroundings of piezoelectric elements in the center portion are hard, the substantial velocity of sound in the piezoelectric element is increased, and hence the resonance frequency is increased. On the other hand, since the surroundings of piezoelectric elements in the peripheral portion are soft, the resonance frequency of the piezoelectric elements is very close to that in the free condition of the piezoelectric elements. Accordingly, the resonance frequency of the piezoelectric elements in the peripheral portion is lower than the resonance frequency of the piezoelectric element in the center portion.

As a dielectric with relatively high elastic modulus, a material obtained by mixing an epoxy-based resin with a ceramic filler can be used. As a dielectric material used for the peripheral portion, a material can be appropriately selected from a group including an epoxy resin, silicon-based resin, rubber, and the like.

According to the composite piezoelectric transducer of this embodiment, as in the above-mentioned embodiments, the widening of band, and the increase in resolution can be realized.

Embodiment 4

In this embodiment, a method for fabricating the composite piezoelectric transducer in Embodiments 1 to 3 will be described.

Figure 7:
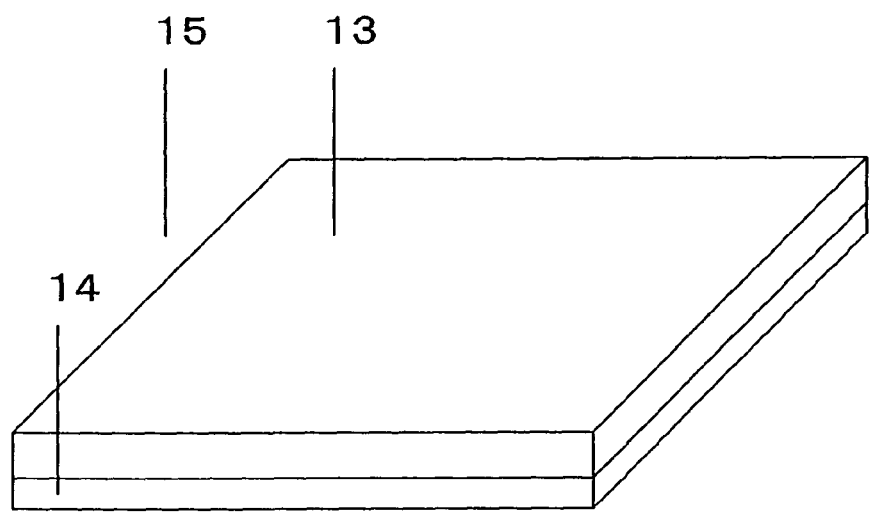
FIG. 7 is a perspective view illustrating a production process of a composite piezoelectric transducer of the invention.
Figure 7:
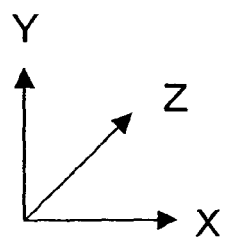

First, FIG. 7 is referred to. FIG. 7 shows a composite plate 15 in which a resin layer 14 is stuck onto one surface of a plate-like piezoelectric element 13. The plate-like piezoelectric element 13 is formed from lead zirconate titanate (PZT), for example. The thickness of the plate-like piezoelectric element 13 used in this embodiment is about 0.05 mm. The piezoelectric ceramic having such a thickness, i.e., a plate-like PZT ceramic can be easily and inexpensively prepared by sintering a low-price ceramic green sheet (thickness: about 0.07 mm). The ceramic green sheet is a sheet which is not yet sintered and is composed of a ceramic powder and a resin. The ceramic green sheet is prepared by a method such as doctor blading, and suitably used for forming a piezoelectric element of a thin-film or layered configuration (such as a laminated substrate). The plate-like piezoelectric element 13 can be prepared by cutting a block-like ceramic. However, the method requires high-cost processes such as a cutting and lapping process. On the contrary, a method for preparing the plate-like piezoelectric element from the ceramic green sheet does not require the processes of cutting, lapping, and the like, so that the method is advantageous in view of reducing the cost.

In the case where the plate-like piezoelectric element 13 is prepared by sintering the ceramic green sheet, in view of reducing the equipment cost, a number of ceramic green sheets are generally stacked and simultaneously sintered. In this case, so as not to join the stacked upper and lower ceramic green sheets together, the stacking is performed in such a manner that a powder called as a peeling powder such as MgO is sprinkled between respective ceramic green sheets. Each of the plate-like piezoelectric elements 13 after the sintering is cleaned for removing the peeling powder. When the size of the plate-like piezoelectric element 13 is about 15 mm square, it is necessary to ensure sufficient strength by setting the thickness to be about 30 $\mu$m or more, so as to facilitate the handling thereof. In the case of a thin plate-like piezoelectric element 13 having the thickness less than about 30 $\mu$m, the handling is difficult, so that fracture or chip often occurs during the handling. As a result, the production yield is reduced and the cost is disadvantageously increased.

As the resin layer 14, a sheet of an epoxy-based resin in a tack condition is commercially available. Such a sheet can be usefully employed. The resin layer 14 of such a resin sheet is disposed on the plate-like piezoelectric element 13, and the temperature is increased with applying a pressure, so as to harden the resin layer 14. As a result, a composite plate 15 can be prepared. Specifically, an epoxy-based tack resin (the resin layer 14) with a peeling film attached on one face is stacked on the plate-like piezoelectric element 13, and then they are layered 120 times by means of a piston-like jig. Thereafter, a pressure is applied to the layered structure of the plate-like piezoelectric element 13 and the resin layer 14, while the layered structure is still in the jig. Concretely, for example, in an atmosphere of 120° C. and 0.1 Torr or less, the pressuring may be performed for 5 minutes while a pressure of about 1 MPa is applied. Thereafter, the atmosphere is returned to be atmospheric and the pressure is released. Then, they are held at 150° C. for one hour. After the resin layer 14 is hardened in this way, the layered structure is taken out of the jig. By peeling the peeling film, 120 composite plates 15 can be obtained.

Instead of the using of the resin sheet as the resin layer 14, the resin layer 14 can be formed by applying a liquid resin on the plate-like piezoelectric element 13 by means of spin coating or the like, and then hardening the resin.

If the resin layer 14 is stuck on one face of the plate-like piezoelectric element 13, the thin plate-like piezoelectric element 13 which is relatively fragile is protected by the resin layer 14, so that the handling of the piezoelectric element 13 is easily performed.

The piezoelectric element 13 and the resin layer 14 used in this embodiment have sizes of 15 mm in X direction, and 15 mm in Y direction, respectively. The sizes in Z direction of the piezoelectric element 13 and the resin layer 14 are 0.05 mm and 0.025 mm, respectively. Accordingly, the thickness of the obtained composite plate is 0.075 mm.

Figure 8:
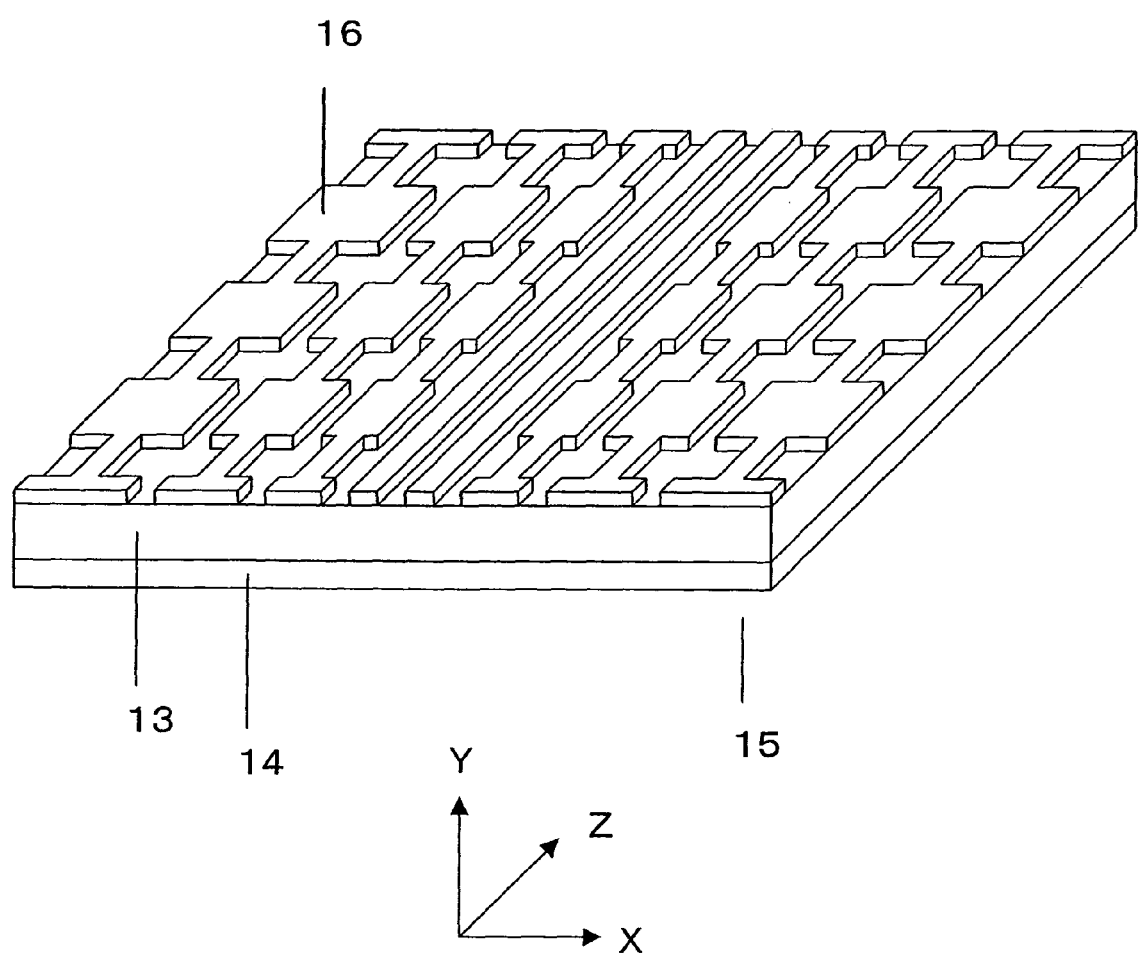
FIG. 8 is a perspective view illustrating a production process of the composite piezoelectric transducer of the invention.

On an exposed surface f the plate-like piezoelectric element 13 of the composite plate 15 in FIG. 7, a working mask 16 is formed, as shown in FIG. 8. The mask 16 used in this embodiment has a pattern for preparing the composite piezoelectric transducer of Embodiment 1. That is, the mask 16 has a pattern in which the cross-section of the piezoelectric element 2 shown in FIG. 3 is repetitively and continuously arranged along the Z direction. In the cases of preparing a composite piezoelectric transducer having any one of the configurations in FIGS. 5A to 5D, a mask having a patterns in which the corresponding one of the cross-sections of FIGS. 5A to 5D is repetitively and continuously arranged may be used. The exposed face of the plate-like piezoelectric element 13 on which the mask 16 of FIG. 8 is formed is in parallel to the X-Z plane which is perpendicular to the Y direction. The oscillating direction of the composite piezoelectric transducer which is finally produced is the Z direction.

The mask 16 includes a pattern element of a line shape having a size in X direction (width) of 0.05 mm in the center portion in the X direction. In both end portions in the X direction, with respect to the line element having the same width as that in the center portion, rectangular land portions each having sizes of 0.10 mm and 0.2 mm are added at intervals of 0.15 mm along the Z direction.

In a region between the center portion in the X direction and the both end portions in the X direction, a rectangular land portion of 0.05 to 0.10 mm is disposed so as to have a size corresponding to the position in the X direction.

The mask 16 is formed by, after a photosensitive resin sheet is stuck to the plate-like piezoelectric element 13, exposing and developing the resin layer by using a photo mask. In the photo mask, a light-blocking pattern for defining the pattern shown in FIG. 8 is formed, and the development and exposure of the photosensitive resin sheet can be performed by known photolithographic techniques. By changing the pattern of the photo mask, the shape and the size of the pattern of the mask 16 can be arbitrarily set.

Next, sand blasting is performed for the face of the composite plate 15 on which the working mask 16 is formed. The sand blasting is a working process in which fine particles (particles of alumina or diamond) are injected together with compressed air, so that an object to be worked is broken by means of impact.

By sand blasting, a soft material such as a resin is not broken, but a hard material such as ceramic can be selectively broken by brittle fracture. Accordingly by performing the sand blasting with the working mask 16 of resin, only a region of the surface of the plate-like piezoelectric element 13 which is not covered with the working mask can be selectively chipped.

Figure 9A:
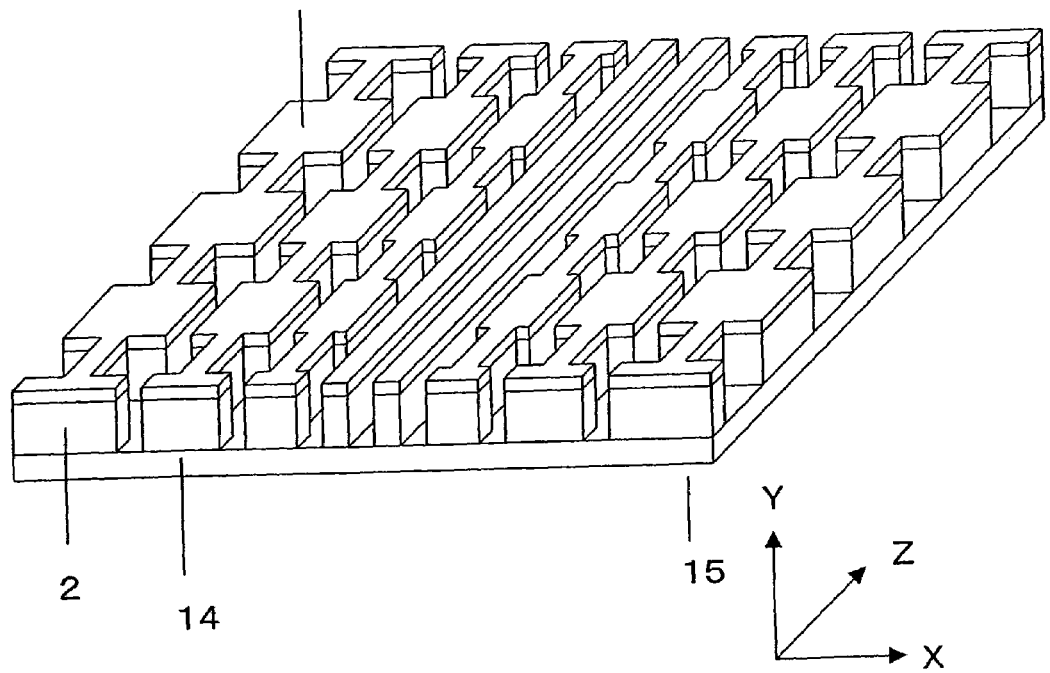
FIGS. 9A and 9B are perspective views illustrating production processes of the composite piezoelectric transducer of the invention.
Figure 9B:
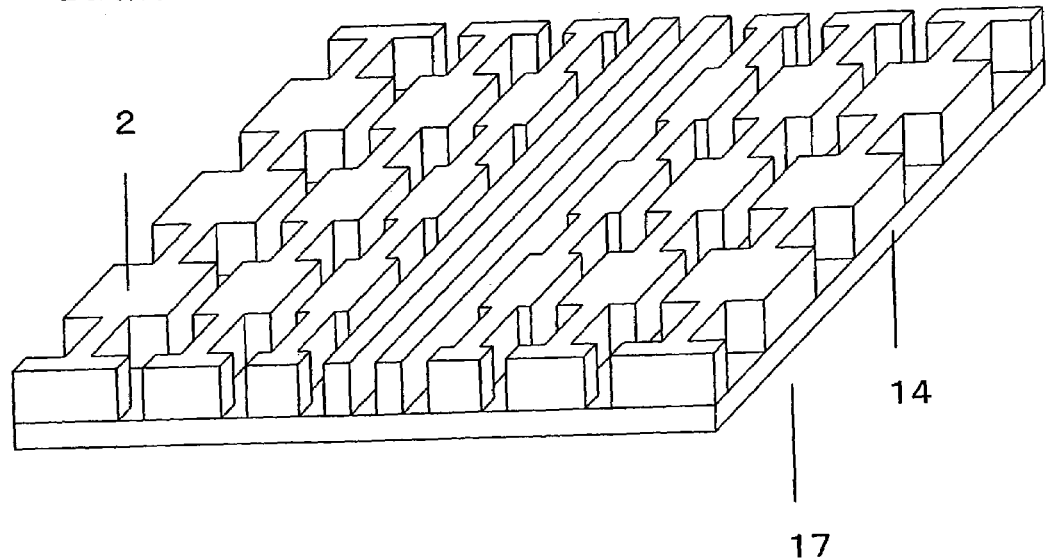

As the sand blasting progresses, the resin layer 14 disposed on the back face side of the plate-like piezoelectric element 13 is exposed, but the resin layer 14 is hardly broken similarly to the working mask 16. In this way, as shown in FIG. 9A, a plurality of piezoelectric elements 2 can be formed from one plate-like piezoelectric element 13. In FIGS. 9A and 9B, eight piezoelectric elements 2 are shown. In actuality, 13 to several hundreds of piezoelectric elements 2 are formed from one plate-like piezoelectric element 13.

According to the above-mentioned sand blasting, a wide face of the plate-like piezoelectric element 13 can be collectively processed at high speed with high precision. However, the sand blasting is not suitable in the case where a ratio of a depth to a width of an opening portion of the working mask 16 (aspect ratio) is high. However, in this embodiment, a depth direction of the cutting groove formed by the sand blasting is not parallel to but perpendicular to a longitudinal direction of the piezoelectric element 2 to be formed. Accordingly, when a depth of the cutting groove formed by the working is D, and a width of the cutting groove is W, the ratio D/W in this embodiment is about 1. The ratio D/W defines the aspect ratio of the cutting groove. Depending on the material of the piezoelectric element, it is preferred that the ratio D/W is set in the range of about 1 to 2. In addition, when fine working is especially required, the ratio D/W is desired to be 1 or less.

In this embodiment, as described above, since the working of the piezoelectric element is performed in a direction perpendicular to the longitudinal direction (Z direction) of the columnar piezoelectric element 2, even if the "aspect ratio of the columnar piezoelectric element 2" exceeds 5, the aspect ratio of the cutting groove can be reduced. Accordingly, it is possible to easily form a columnar piezoelectric element having an aspect ratio which cannot be realized in the prior art. In addition, it is possible to form an arbitrary configuration in which the center portion is made wider, or narrower with respect to the Z direction, while such a configuration is impossible in the prior art.

After the processing, the mask 16 is peeled, so as to obtain a unit composite sheet 17 having a configuration in which a plurality of piezoelectric elements 2 are held by the resin layer 14, as shown in FIG. 9B. If the cutting method can work the plate-like piezoelectric element 13 into a predetermined shape, the method is not limited to the sand blasting. Other cutting methods such as ultrasonic machining, laser processing may be employed.

Next, 300 unit composite sheets each of which is prepared by the above-described method are prepared, and a process of lamination and integration is performed. A large area of the composite sheets can be simultaneously processed by the sand blasting, so that a time required for cutting the 300 sheets of the composite plates having the above-mentioned sizes is 2 hours or less which is very short. Therefore, it is possible to shorten the production time of the unit composite sheets and to reduce the cost.

Figure 10:
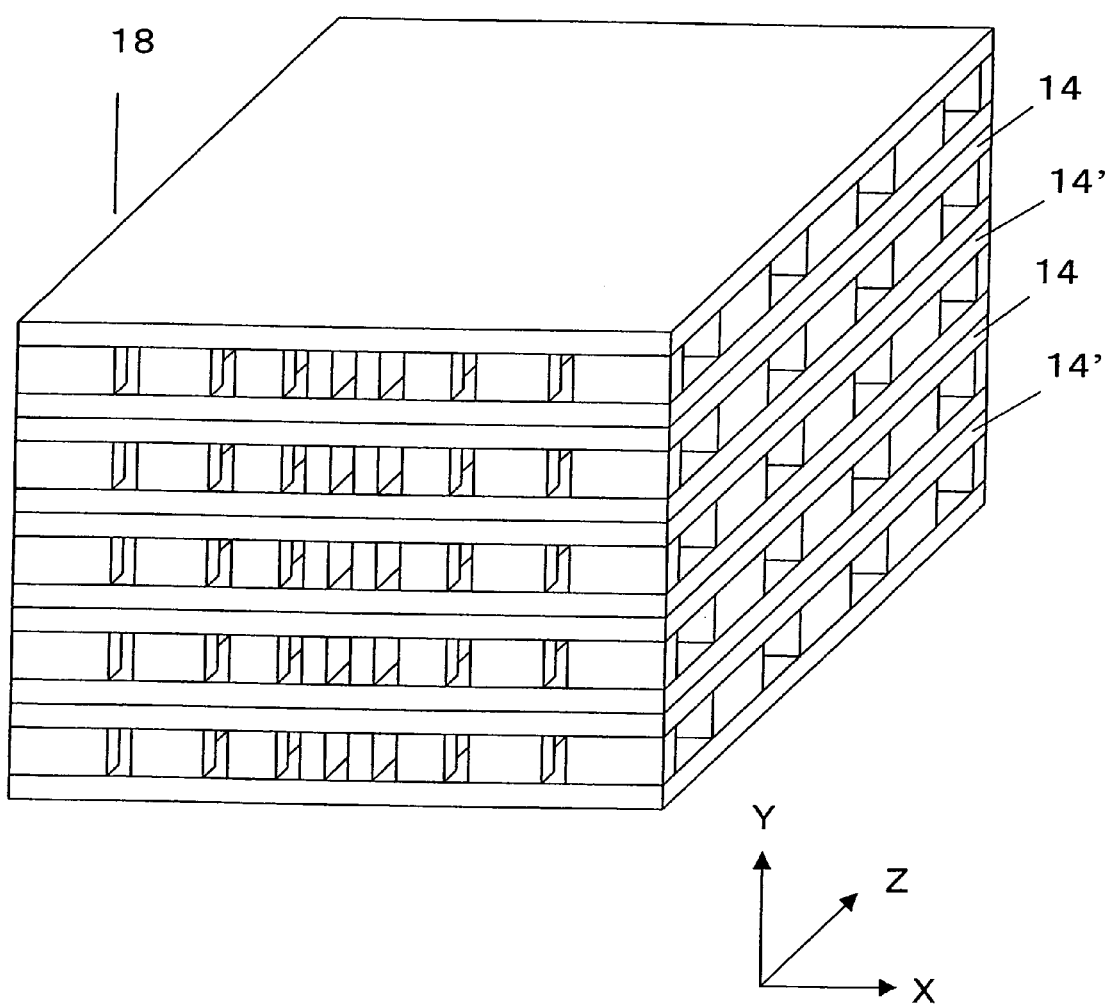
FIG. 10 is a perspective view illustrating a production process of the composite piezoelectric transducer of the invention.

Next, as shown in FIG. 10, the unit composite sheets are layered with another resin layer 14' which is different from the resin layer 14 constituting the unit composite sheet interposed therebetween. In FIG. 10, for simplicity, five unit composite sheets 17 are shown. In actuality, 300 unit composite sheets 17 are layered. In layering, the unit composite sheets are disposed in such a manner that the columnar piezoelectric elements in each layer are substantially parallel to each other. In the uppermost portion, an epoxy-based tack resin sheet having the same sizes in X direction and Y direction, as those of the composite plate, and having the thickness of 0.025 mm is disposed.

The thus-layered structure is heated while a pressure is applied thereto, so as to harden and integrate the resin. As a result, a composite piezoelectric block 18 as a layered structure of unit composite sheets is obtained. Specifically, the thus-layered structure is left for 10 minutes while applying a pressure of about 0.1 MPa at 120° C. and 0.1 Torr or less. Thereafter, the pressure is returned to be atmospheric, and the layered structure is heated for 1 hour at 180° C. without applying a pressure. As a result, the resin layers 14 and 14' are hardened, and the layered structure is integrated, thereby obtaining a composite piezoelectric block 18 as a composite sheet layered structure. The obtained composite piezoelectric block 18 has a rectangular parallelepiped shape having sizes of 15 mm in X direction, 30 mm in Y direction, and 15 mm in Z direction. In one composite piezoelectric block 18, 30,000 piezoelectric elements 2 are held substantially in parallel by means of the resin.

Figure 11:
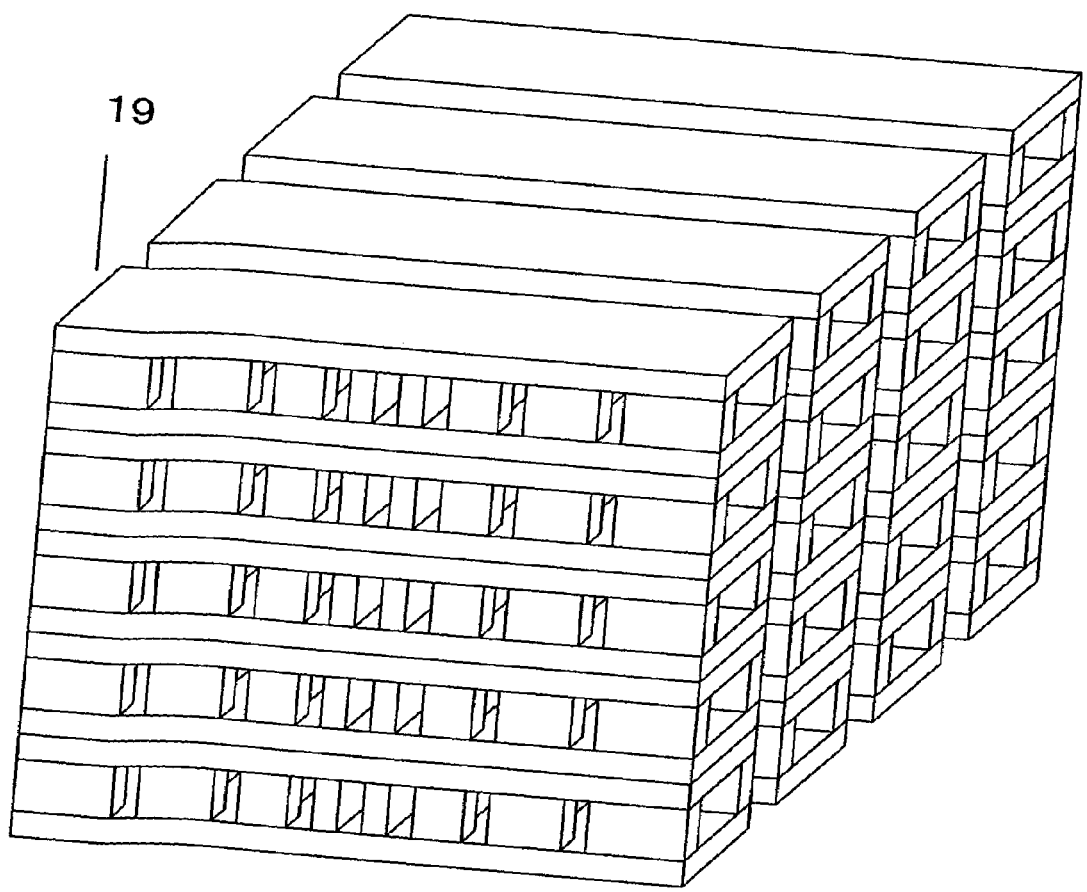
FIG. 11 is a perspective view illustrating a production process of the composite piezoelectric transducer of the invention.
Figure 11:
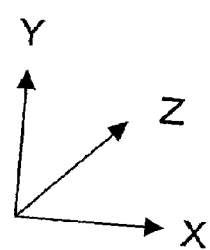

Next, as shown in FIG. 11, the composite piezoelectric block 18 is cut along a plane perpendicular to the Z direction and separated into a plurality of composite piezoelectric transducers 19. In the cutting, the cutting pitch is 0.35 mm, and the cutting margin is 0.1 mm, so that the start position of cutting is set to be the center portion which has a wider diameter of the piezoelectric element.

In such a cutting condition, 42 composite piezoelectric transducers 19 each having sizes of 15 mm in X direction, 30 mm in Y direction, and 0.25 mm in Z direction are obtained from a composite piezoelectric block having sizes of 15 mm in X direction, 30 mm in Y direction, and 15 mm in Z direction. For simplicity, FIG. 11 shows only four composite piezoelectric transducers 19.

Next, electrodes are formed on an upper face and a lower face of the obtained composite piezoelectric transducer 19 (both end faces perpendicular to the Z direction), and the polarization process is performed. Thus, a composite piezoelectric transducer exhibiting piezoelectric characteristics is obtained.

According to the method of this embodiment, composite piezoelectric transducers having piezoelectric columns of complicated shapes can be easily formed, and a composite piezoelectric transducer having a resonance frequency distribution can be easily formed. In addition, the thin plate-like piezoelectric element is worked while it is stuck onto the resin layer, so that the arrangement of piezoelectric elements is not required and the piezoelectric elements are not singly handled. Thus, the production thereof can be performed in a short time with good production yield.

Embodiment 5

In the composite piezoelectric transducer shown in FIG. 11, gap portions exist between piezoelectric elements 2 arranged on each unit composite sheet, and the gap portions are filled with the air. Since the air is also dielectric, it is unnecessary to fill the gap portions with another dielectric material, in order to function as a composite piezoelectric transducer. However, if the gap portions are embedded with a dielectric material which can be hardened, and then the dielectric material is hardened, the mechanical strength of the composite piezoelectric transducer can be improved, and preferably, the oscillation mode of the composite piezoelectric transducer can be appropriately adjusted.

In this embodiment, first, a piezoelectric block which is fabricated by the same method as the production method in Embodiment 4 is prepared. Then, gap portions formed between respective piezoelectric elements 2 in the piezoelectric block are filled with a resin as a dielectric material, so as to improve the mechanical strength of the composite piezoelectric transducer. Specifically, the gap portions of the piezoelectric block are impregnated with a filling resin, and then the resin is hardened. Thereafter, similarly to the above-described respective embodiments, the cutting process, the electrode forming process, and the polarization process for the composite piezoelectric transducer 10 are performed.

According to this embodiment, a breakage hardly occurs in process steps such as the cutting steps. As a result, the production yield is increased, and the production cost can be further reduced. When the gap portion is embedded by the resin, two faces on which the electrodes are formed are not conducted via the gap portion. For this reason, if the electrodes are formed by using electroless plating, it is possible to easily prevent the two electrodes from being short-circuited. Accordingly, electrodes can be collectively formed for a number of composite piezoelectric transducers, and the cost can be further reduced.

Embodiment 6

Figure 12A:
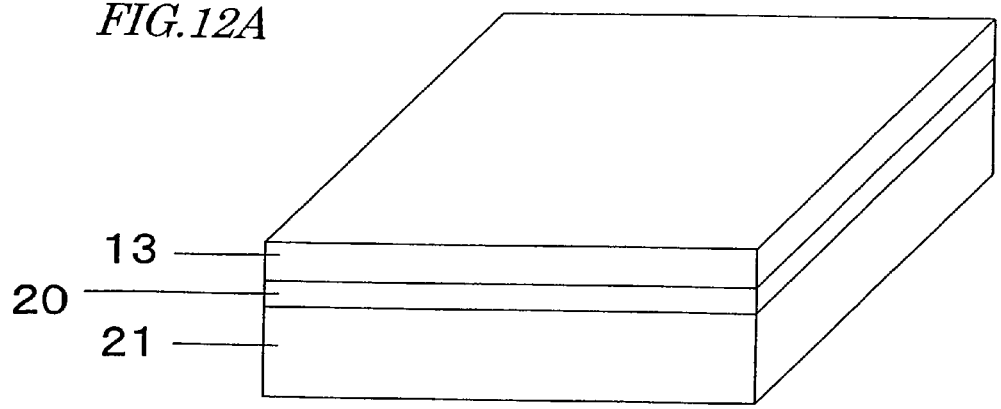
FIGS. 12A to 12C are perspective views illustrating other production processes of the composite piezoelectric transducer of the invention.

In this embodiment, as shown in FIG. 12A, a process of temporarily fixing a plate-like piezoelectric element 13 to a glass substrate 21 by means of an adhesive sheet 20 is performed, so as to form a unit composite sheet. As the adhesive sheet 20, a thermally peeling sheet can be employed. The adhesive sheet 20 is not limited to the thermally peeling sheet, but may be an adhesive sheet which can hold the plate-like piezoelectric element 13 and from which the plate-like piezoelectric element is not peeled during the cutting process, but is peeled by means of any action after the process.

Figure 12B:
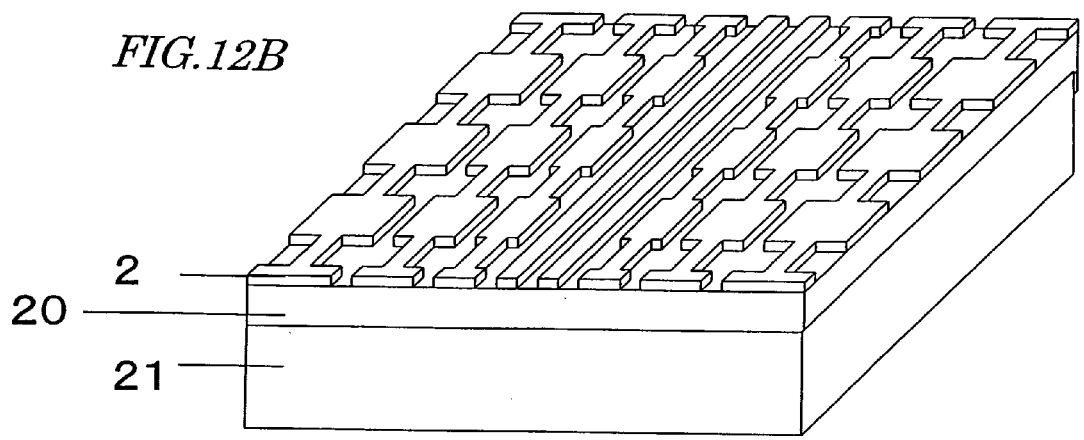

Next, as shown in FIG. 12B, the plate-like composite element 13 is worked by sand blasting, so as to form piezoelectric elements 2 having desired shapes. Before the sand blasting, a mask (not shown) used in Embodiment 4 is formed on the plate-like piezoelectric element 13. In this way, as shown in FIG. 12B, a configuration in which rows of piezoelectric elements 2 are temporarily fixed on the substrate 21 by means of the adhesive sheet 20 can be obtained.

Figure 12C:
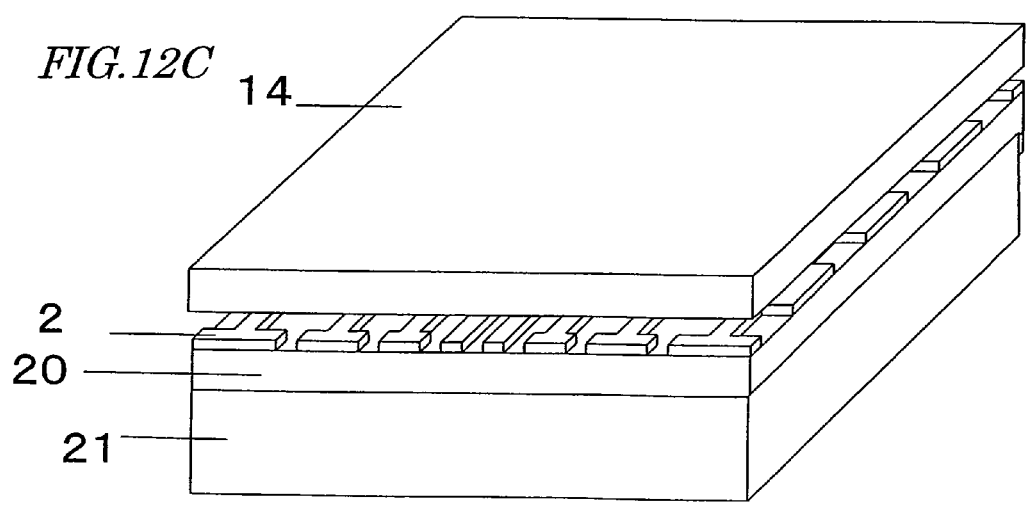

Next, as shown in FIG. 12C, the piezoelectric elements 2 which are temporarily fixed on the substrate 21 are disposed oppositely to the sheet-like resin layer 14, and a heat and a pressure are simultaneously applied to the resin layer 14. As a result, the peeling of the piezoelectric elements 2 from the adhesive sheet 20 and the adhesion to the resin layer 14 are simultaneously performed. With the above-described process steps, a unit composite sheet can be obtained.

The succeeding process steps are performed in the same way as in the above-described method. Finally, a composite piezoelectric transducer shown in FIG. 1 is fabricated.

In the unit composite sheet in this embodiment, since the resin layer is not subjected to the heat history for perfect hardening, the resin layer still has the adhesive strength. For this reason, it is unnecessary to interpose another adhesive sheet for constructing a layered structure. In addition, a relatively high pressure is applied, and part of unit composite sheet is flown and hardened during the layering process, so that a space (gap portions) of the piezoelectric element can be filled with the resin.

Embodiment 7

Each of the composite piezoelectric transducers 1 in the above-described embodiments has a configuration in which the thickness is uniform and the resonance frequency is gradually varied only in the X direction. The composite piezoelectric transducer of the present invention is not limited to the configuration. For example, the composite piezoelectric transducer may have a configuration in which the resonance frequencies of piezoelectric elements are varied depending on the positions thereof as shown in FIG. 3 in the cross-section perpendicular to the X direction, similarly to the cross-section perpendicular to the Y direction.

Figure 13:
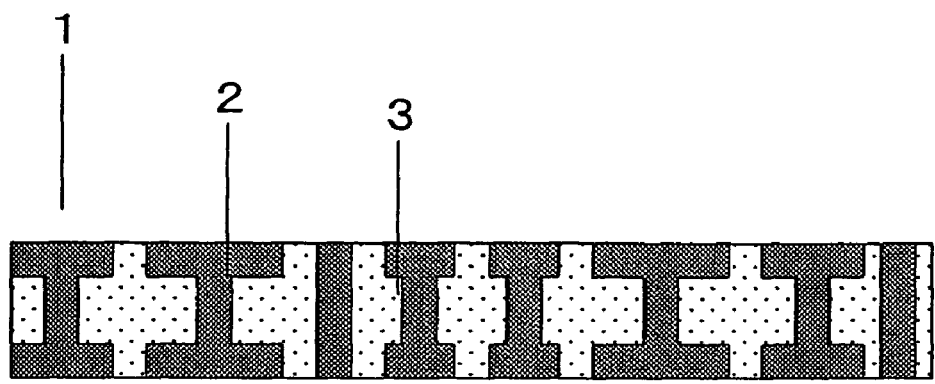
FIG. 13 is a sectional view illustrating another configuration of the composite piezoelectric transducer of the invention.

In the configurations shown in FIGS. 3 and 5, a resonance frequency distribution in which the resonance frequency is the highest in the center portion, and is lowered toward the peripheral portion is obtained. The resonance frequency distribution is not limited to this pattern. FIG. 13 shows a configuration in which the resonance frequency is periodically varied along the X direction (or the Y direction). The distribution pattern of resonance frequency is arbitrarily set according to the use of the composite piezoelectric transducer.

Figure 14:
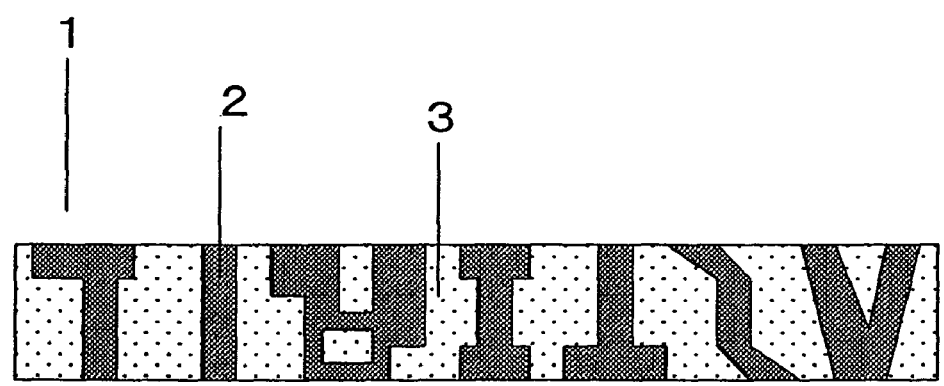
FIG. 14 is a sectional view illustrating still another configuration of the composite piezoelectric transducer of the invention.
Figure 14:
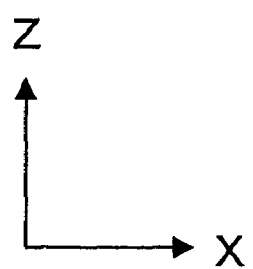

FIG. 14 shows a configuration in which the composite piezoelectric transducer has no symmetric faces perpendicular to the Z direction. According to the production method described with reference to FIG. 9, the shape of the mask 16 can be freely designed, so that the piezoelectric element having the configuration shown in FIG. 14 is easily formed.

With the arrangement of the piezoelectric elements having the configuration shown in FIG. 14, a desired resonance frequency distribution can be obtained.

Figure 15A:
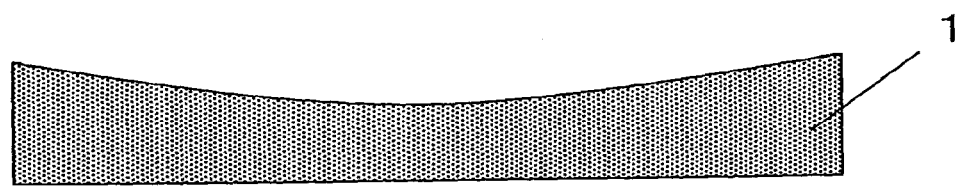
FIGS. 15A and 15B are views illustrating other constructions of the composite piezoelectric transducer of the invention.
Figure 15B:
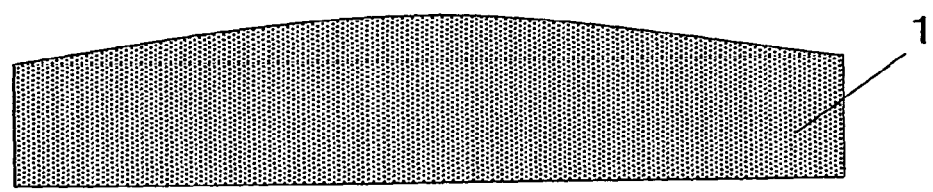
Figure 16:
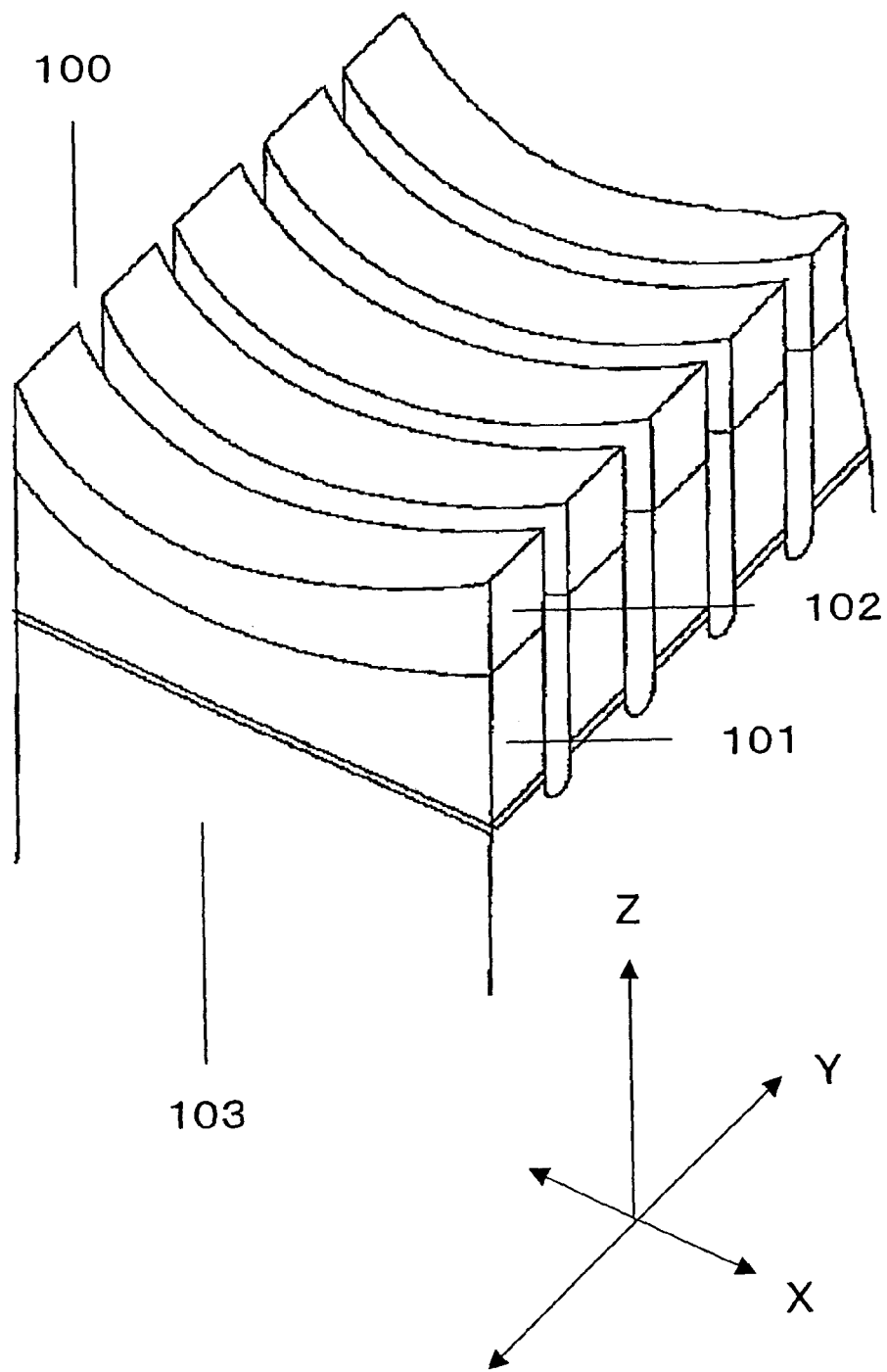
FIG. 16 is a perspective view illustrating a conventional ultrasonic probe.

The composite piezoelectric transducer 1 does not necessarily have a uniform thickness. By changing the shapes of the piezoelectric elements, an arbitrary distribution can be applied to the resonance frequencies of the emitted ultrasonic waves, while the thickness of the composite piezoelectric transducer is uniform in the plane. However, the thickness may be varied depending on the positions for other purposes. For example, for the purpose of converging or diverging the ultrasonic wave, a composite piezoelectric transducer 1 having a configuration shown in FIG. 15A or 15B may be fabricated. In this case, the shape of the piezoelectric element which is not shown, an elastic modulus of a dielectric portion, and the like are appropriately changed depending on the positions thereof, thereby changing the resonance frequency.

According to the present invention, in a composite piezoelectric transducer having a configuration in which a plurality of piezoelectric elements are arranged in a dielectric element, since the piezoelectric elements have different shapes depending on the positions thereof, the resonance frequency can be varied in the ultrasonic emitting face of the composite piezoelectric transducer. According to the composite piezoelectric transducer of the present invention, although the composite piezoelectric transducer has a plate-like shape, the transmission and receiving of ultrasonic waves in a wide band can be realized. In addition, a predetermined distribution is applied to the resonance frequency of ultrasonic waves to be transmitted or received, in the plane of the composite piezoelectric transducer, so that the resolution of the ultrasonic probe can be improved.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A composite piezoelectric transducer comprising: a plurality of arranged piezoelectric elements; and dielectric portions positioned between the plurality of piezoelectric elements, wherein an area of a cross-section perpendicular to an ultrasonic emitting direction in at least one piezoelectric element of the plurality of piezoelectric elements varies along the ultrasonic emitting direction; wherein the resonance frequencies of the plurality of piezoelectric elements have a distribution in which a difference between the minimum value and the maximum value is equal to or more than 10% of a mean value.

2. The composite piezoelectric transducer of claim 1, wherein the at least one piezoelectric element has a resonance frequency which is different from resonance frequencies of the other piezoelectric elements.

3. The composite piezoelectric transducer of claim 1, wherein each of the plurality of piezoelectric elements has a size in a certain direction perpendicular to the ultrasonic emitting direction, the size being fixed along the ultrasonic emitting direction.

4. The composite piezoelectric transducer of claim 1, wherein each of the plurality of piezoelectric elements has a uniform thickness along the ultrasonic emitting direction.

5. The composite piezoelectric transducer of claim 1, wherein the plurality of piezoelectric elements are two-dimensionally arranged along a plane perpendicular to the ultrasonic emitting direction of the piezoelectric elements, and resonance frequencies of the plurality of piezoelectric elements are varied depending on the positions thereof in the plane.

6. The composite piezoelectric transducer of claim 1, wherein the plurality of piezoelectric elements have a substantially uniform height.

7. The composite piezoelectric transducer of claim 1, wherein resonance frequencies of the piezoelectric elements in a peripheral portion of a plane perpendicular to the ultrasonic emitting direction of the piezoelectric elements are lower than resonance frequencies of the piezoelectric elements in a center portion of the plane.

8. The composite piezoelectric transducer of claim 1, wherein an area of a cross-section perpendicular to an ultrasonic emitting direction of at least one of the plurality of piezoelectric elements in an end face of the piezoelectric element is larger than the area in a center of the piezoelectric element.

9. The composite piezoelectric transducer of claim 1, wherein an area of a cross-section perpendicular to an ultrasonic emitting direction of at least one of the plurality of piezoelectric elements in an end face of the piezoelectric element is smaller than the area in a center of the piezoelectric element.

10. The composite piezoelectric transducer of claim 1, wherein each of the plurality of piezoelectric elements has a pair of columnar portions extending in the ultrasonic emitting direction, and a thickness of a bridging portion for coupling the columnar portions in the middle thereof is varied in a plane perpendicular to the ultrasonic emitting direction of the piezoelectric elements.

11. The composite piezoelectric transducer of claim 1, wherein each of the plurality of piezoelectric elements has an opening portion in the center thereof, and a size of the opening portion is varied in a plane perpendicular to the ultrasonic emitting direction of the piezoelectric elements.

12. The composite piezoelectric transducer of claim 1, wherein shapes of the plurality of piezoelectric elements are selected so that resonance frequencies of the plurality of piezoelectric elements have a predetermined distribution in plane.

13. The composite piezoelectric transducer of claim 1, wherein a ratio of a size in the ultrasonic emitting direction of the piezoelectric element to the minimum size S of a cross-section perpendicular to the ultrasonic emitting direction of the piezoelectric element is 5 or more.

14. The composite piezoelectric transducer of claim 1, wherein the dielectric portion is formed from a resin.

15. The composite piezoelectric transducer of claim 14, wherein a modulus of elasticity of the resin has a predetermined distribution in accordance with positions of the piezoelectric elements in a plane perpendicular to the ultrasonic emitting direction.

16. A composite piezoelectric transducer comprising: a plurality of arranged piezoelectric elements; and dielectric portions positioned between the plurality of piezoelectric elements, wherein an area of a cross-section perpendicular to an ultrasonic emitting direction in at least one piezoelectric element of the plurality of piezoelectric elements varies along the ultrasonic emitting direction, wherein each of the plurality of piezoelectric elements has a pair of columnar portions extending in the ultrasonic emitting direction, and wherein a thickness of a bridging portion for coupling the columnar portions in the middle thereof is varied in a plane perpendicular to the ultrasonic emitting direction of the piezoelectric elements.

17. A composite piezoelectric transducer comprising: a plurality of arranged piezoelectric elements; and dielectric portions positioned between the plurality of piezoelectric elements, wherein an area of a cross-section perpendicular to an ultrasonic emitting direction in at least one piezoelectric element of the plurality of piezoelectric elements varies along the ultrasonic emitting direction, wherein each of the plurality of piezoelectric elements has an opening portion in the center thereof, and wherein a size of the opening portion is varied in a plane perpendicular to the ultrasonic emitting direction of the piezoelectric elements.

18. A composite piezoelectric transducer comprising: a plurality of arranged piezoelectric elements; and dielectric portions positioned between the plurality of piezoelectric elements, wherein an area of a cross-section perpendicular to an ultrasonic emitting direction in at least one piezoelectric element of the plurality of piezoelectric elements varies along the ultrasonic emitting direction, and wherein a ratio of a size in the ultrasonic emitting direction of the piezoelectric element to the minimum size S of a cross-section perpendicular to the ultrasonic emitting direction of the piezoelectric element is 5 or more.

\* \* \* \* \*